United States Patent [19]

Urquhart et al.

[11] Patent Number: 4,912,022
[45] Date of Patent: Mar. 27, 1990

[54] METHOD FOR SLOPING THE PROFILE OF AN OPENING IN RESIST

[75] Inventors: Andy Urquhart, Pflugerville; Kam-Shui Chan; Gregory D. Anderson, both of Austin, all of Tex.

[73] Assignee: Motorola, Inc., Schaumburg, Ill.

[21] Appl. No.: 290,548

[22] Filed: Dec. 27, 1988

[51] Int. Cl.[4] ............................................... G02B 5/00
[52] U.S. Cl. ....................................... 430/396; 430/5; 430/290; 430/322; 430/327
[58] Field of Search ............... 430/290, 322, 327, 396, 430/5

[56] References Cited

U.S. PATENT DOCUMENTS 4,762,396  8/1988  Dumant et al. .................. 350/320

Primary Examiner—Paul R. Michl
Assistant Examiner—Thorl Chea
Attorney, Agent, or Firm—John A. Fisher

[57] ABSTRACT

A lithography method for forming an opening in a resist layer with a sloped profile is disclosed which requires no additional processing steps or equipment. A scattering element, for example a ground glass diffuser, is placed in the optical path of radiation passing through a standard lithography apparatus. The scattering element modifies the radiation passing through the lithography apparatus with the result that the developed resist profile exhibits sloped edges. The slope modification can be conveniently changed by exchanging the optical scattering element used.

14 Claims, 4 Drawing Sheets

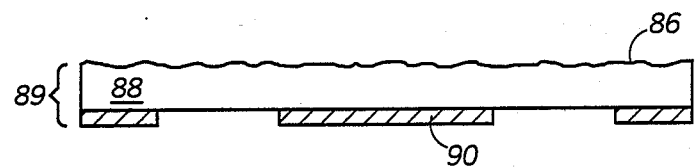
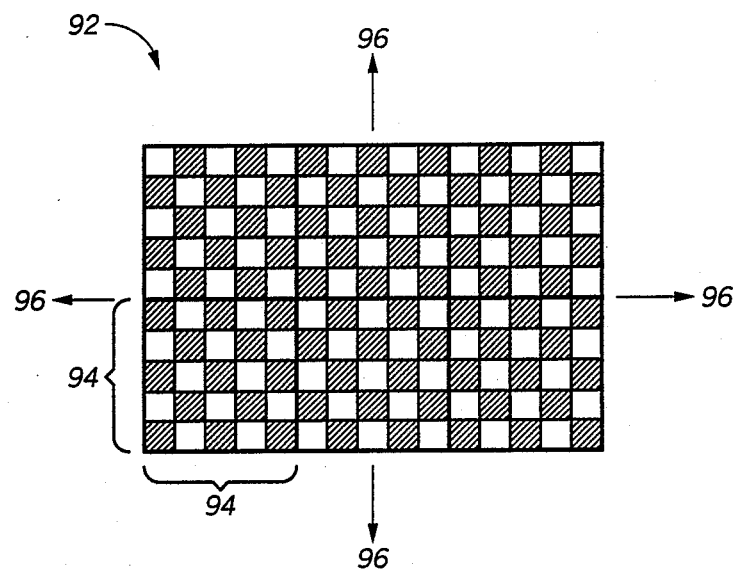
*FIG.5*
*FIG.6*

METHOD FOR SLOPING THE PROFILE OF AN OPENING IN RESIST

BACKGROUND OF THE INVENTION

This invention relates generally to a process for irradiating a resist layer, and more specifically to an improved process for sloping the profile of openings formed in a resist layer during the manufacture of semiconductor devices.

Lithography, as used in the manufacture of semiconductor devices, is the process of transferring a collection of geometric patterns on a mask, or reticle, to the surface of a semiconductor wafer and is well known. The lithographic mask used can consist, for example, of a quartz substrate with the desired geometric pattern formed in a thin layer of chrome on one face of the substrate. These transferred patterns will form the component parts of the final integrated circuit such as gate electrodes, interconnecting conducting lines, and transistor device terminals. Each of these component parts is formed in a lengthy process sequence including many interspersed lithography steps with one component part being formed at each lithography step.

In a typical semiconductor lithography process, a photosensitive polymer film, or resist, is formed over a silicon substrate, dried, and then exposed to ultraviolet (UV) or other radiation passing through a mask containing a geometric pattern. If the radiation source is light, then the lithography technique is called photolithography. The silicon substrate is then soaked in a developer which develops the image irradiated onto the polymer film. In the case of a positive resist, the exposed areas of the resist are dissolved and removed by the developer. Conversely, in the case of a negative resist the unexposed areas of the resist are dissolved and removed by the developer. For either type of resist the positive or negative image of the mask pattern is formed in the resist remaining on the silicon substrate. In order to permanently form the pattern in the underlying silicon substrate, the substrate is placed in an ambient which etches surface areas not protected by resist patterns. Finally, the resist pattern is removed, for example by a suitable solvent or dry oxidation, leaving the transferred mask pattern formed in the surface of the silicon substrate.

The edges of the openings formed in the developed resist will have a slope which is characteristic of the lithography method used. It is known that this slope can be imparted to the edges of the openings and features formed in the underlying substrate surface during the etching of the unprotected surface areas, and that additionally, this resist slope can be controlled by selecting an appropriate lithography method. Thus, by controlling the slope of the resist, it is possible to control the slope of the features formed in the underlying substrate surface.

Control of the resist slope is advantageous in semiconductor fabrication, for example in the formation of contact openings to be covered or filled with aluminum metallization and interconnecting conductors (interconnect). It is known that aluminum contacts formed in contact openings with steep, or substantially vertical, slopes are prone to stress-related aluminum cracking or poor contact coverage, and that interconnect formed with steep edges reduces the step coverage of overlying layers formed later in the process. As the number of overlying layers increases, the step coverage reduction becomes even more pronounced. For example, in a double-level metal process, if the first-level metal formed has sloped edges which tend to flatten the surface topography, the subsequently deposited second-level metal and dielectric layers will exhibit improved step coverage.

One existing method for controlling the slope of the resist profile is image defocusing which is performed by slightly moving the resist surface out of the image plane of the optical system. This movement will change the aerial image, defined as the spatially dependent radiation-intensity pattern irradiating the resist, and cause a modification of the resist slope. However, there are several problems associated with defocusing. First, the projected image of the pattern on the resist is distorted as a consequence of moving the resist away from the image plane, and this distortion is randomly variable across the full image field such that control of linewidths to be developed in the resist is unreliable and inconsistent. Second, the distorted mask image produces similarly distorted features in the silicon surface that will partially misalign with features formed in other preceding or subsequent lithographic steps in the process. Such misalignment affects semiconductor device reliability and function.

An alternate method to image defocusing is the slope-bake technique in which the resist viscosity is altered following development to cause a flowing of the resist and thus a modification in the slope of the resist edges. There are several disadvantages to this technique: the introduction of a number of extra processing steps, the need for additional dedicated process equipment, the image distortion due to resist flow, and the loss of dimensional control.

Another alternative directly modifies the pattern on the mask by the addition of narrow stripes to the mask pattern spaced a small distance from the pattern edges on the mask which corresponds to features on the silicon substrate in which a slope modification is desired. The addition of these stripes modifies the aerial image on the resist. But there are numerous disadvantages to this method. The addition of many narrow stripes to the already small geometric patterns of the mask is limited by the resolution of the electron beam used to create the mask and increases the complexity and cost of the mask creation process. Also, these stripes are a permanent change in the mask. There is now way to easily and conveniently alter the character of the stripes on the mask in order to vary the resist slope in response to changes in other parts of the process, for example the use of different resist types. Indeed, new masks must be created to introduce resist slope-control into an existing process or to change the degree of slope modification. Further, the mask created for resist slope modification is dedicated to one specific product and cannot be used for slope modification on other products. Additionally, because the stripes added to the mask decrease the proportion of transparent areas on the mask relative to opaque areas, the efficiency of radiation transmission through the mask is decreased for a given desired mask pattern.

Accordingly, a need existed for a lithography method for modifying the slope of the resist profile in a convenient and flexible manner with undistorted and reliable transfer of the mask pattern to the silicon substrate without additional processing steps.

It is therefore an object of this invention to provide an improved method for sloping the resist profile during lithography.

It is a further object of this invention to provide an improved method for sloping the resist profile which does not require a substantial increase in the number of process steps or process equipment.

It is still a further object of this invention to provide an improved method for sloping the resist profile that does not substantially distort the mask pattern to be transferred.

Still another object of this invention is to provide an improved method for sloping the resist profile during lithography that is flexible.

BRIEF SUMMARY OF THE INVENTION

The foregoing and other objects and advantages of the present invention are achieved through a method for forming sloped edges in the openings on a resist surface during lithography. In accordance with one embodiment of the invention, an optical scattering surface is provided positioned above a lithography mask. A radiation source is positioned above the scattering surface and irradiates a resist layer positioned below the mask. The scattering surface modifies the radiation passing through the mask with the result that the developed resist profile exhibits sloped edges. The slope modification can be conveniently changed by exchanging the optical scattering surface used. The invention can be applied to the formation of either, or both, contact openings and interconnect in semiconductor devices.

BRIEF DESCRIPTION OF THE DRAWINGS

FIG. 5 illustrates, in cross-section, the use of a ground surface on a mask as a scattering element in accordance with another embodiment of the invention;

FIG. 6 illustrates a top view of a section of a uniform mesh in accordance with yet another embodiment of the invention.

DETAILED DESCRIPTION OF THE PREFERRED EMBODIMENTS

Figure 1:
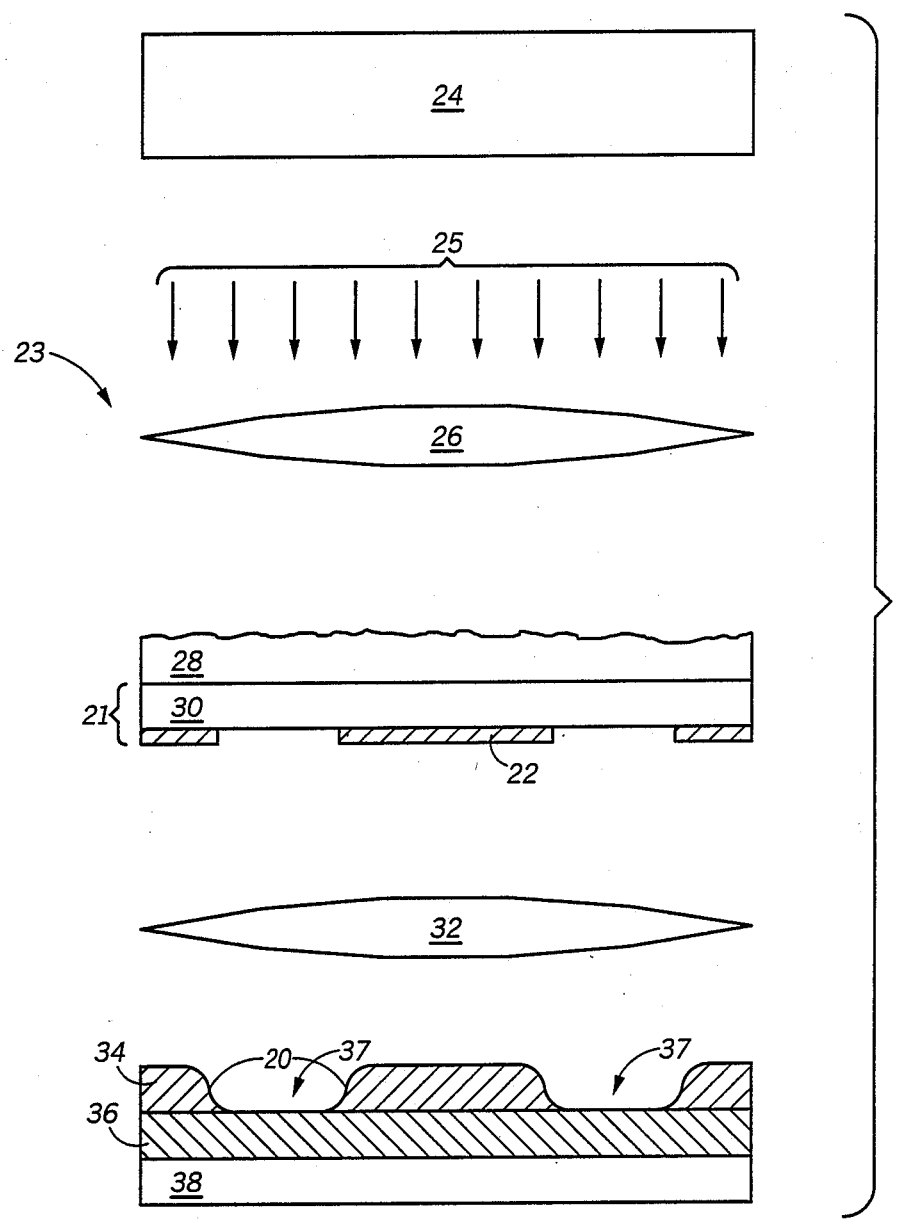
FIG. 1 illustrates a portion of a lithography apparatus used in a method in accordance with one embodiment of the invention.

A portion of a lithographic apparatus used in a resist exposure method in accordance with one embodiment of the invention is illustrated in FIG. 1. A radiation source 24 provides radiation 25 which irradiates resist layer 34 by passing through an upper lens 26, a scattering element 28, a patterned lithographic mask 21, and a lower lens 32. The radiation, which may be either coherent or incoherent, can consist of, for example, ultra-violet light, x-rays, an electron beam, or an ion beam. The mask 21 has a transparent substrate 30, for example of quartz, supporting an opaque pattern 22, for example of chrome. Within the opaque pattern are openings through which the radiation 25 will pass. The optical system 23 illustrated, consisting of lenses 26 and 32, is only a part of one possible system among many well known optical lithography systems which may be used in an embodiment of the present invention. Other optical systems may use a combination including, but not limited to, reflective, electrical, and mirror-like optical elements. The present invention can be implemented in substantially all of these systems.

Though scattering element 28 is shown positioned above and adjacent to lithography mask 21, the invention includes embodiments in which scattering element 28 is positioned at other locations above or below mask 21, separated from or adjoining mask 21, or positioned at varying locations with respect to optical system 23 while in optical alignment with radiation source 24 and resist layer 34. The material forming scattering element 28 will correspond to the type of radiation 25 used and may be, for example, quartz when using ultra-violet light radiation. Also, scattering element 28 can be, for example, a diffuser. Likewise, the material forming transparent substrate 30 will vary with the radiation used in the particular embodiment.

Resist layer 34 overlies on etchable surface layer 36 which will eventually contain the features to be formed by the method of the invention. Surface layer 36 can be, for example, an oxide, metal, or polycrystalline silicon (polysilicon) layer, and overlies substrate 38 which may be, for example, a silicon substrate or other layer used in a semiconductor manufacturing process. Openings 37 in resist layer 34 are shown with resist edges 20 having a slope formed and varied by the method of the present invention. Resist layer 34 is preferably of thickness 0.5 to 2.5 microns.

The openings 37 may be, for example, apertures formed in preparation for contact holes to be opened later in surface layer 36. Alternately, openings 37 may be the voids located alongside remaining regions of resist layer 34 which are patterned as elongated, raised strips. The pattern of these elongated strips will be transferred from resist layer 34 into the underlying layer 36, for example to form interconnect.

It should be appreciated that the present invention makes use of standard, well known lithography equipment without modification other than that necessary to introduce scattering element 28 into the optical path of radiation 25.

FIGS. 2A-2D illustrate in cross-section a process for forming sloped openings 48 in a conducting layer 42 on a semiconductor device in accordance with one embodiment of the invention. In this process, resist 40 will be irradiated by radiation which has passed through a mask and a scattering element. Openings 48 will be formed in resist 40 and then transferred to underlying layer 42. Resist 40 will then be removed, and layer 52 deposited overlying the remaining layer 42 and substrate 44.

Figure 2A:
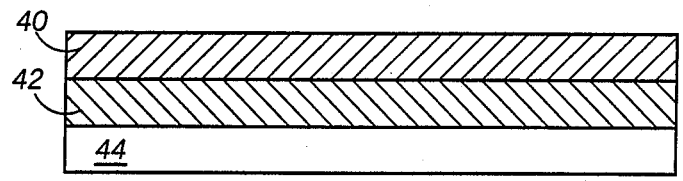
FIGS. 2A-2D illustrate process steps, in cross-section, in accordance with one embodiment of the invention.

FIG. 2A shows a substrate 44 which can be silicon or an oxide or any of many intermediate layers formed during a standard semiconductor process. A conducting layer 42 has been formed overlying substrate 44, and a resist 40 has been deposited overlying conducting layer 42 by any of several well known semiconductor processes.

Figure 2B:
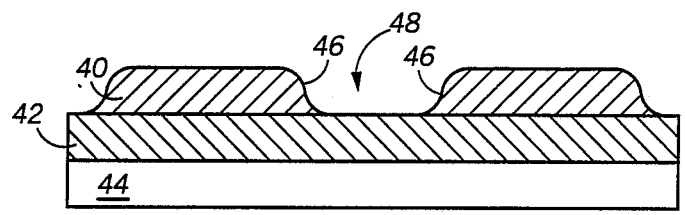

Referring to FIG. 2B, the process continues with the irradiation of the resist 40, for example by a lithography apparatus as described earlier in FIG. 1. In the case of a positive resist, the exposed regions of resist 40 will be removed during subsequent developing, and conversely for a negative resist the unexposed regions of resist 40 will be removed.

Because the radiation used to expose the resist 40 is scattered, the image of the mask pattern on resist 40 is more diffusely defined than if unscattered radiation were used. The intensity of the radiation impinging resist 40 decreases gradually, rather than abruptly, away from the center of the regions of resist 40 which will later be removed to form openings 48. The regions of resist 40 exposed to the greatest radiation intensity will be removed completely, while the regions exposed to a gradually decreasing intensity of radiation, specifically at the edges 46, will be partially removed forming a slope in the remaining resist 40. Regions of resist 40 exposed to no radiation remain overlying layer 42. Thus, following a standard developing step, resist 40 will contain sloped openings 48 exposing a portion of the underlying conducting layer 42. Additionally, the slope of edges 46 frequently exhibits a substantially Gaussian shape which is related to the random nature of the scattered radiation used to expose resist 40.

Figure 2C:
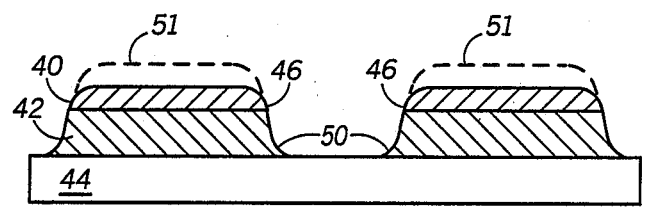

In FIG. 2C the slope in the resist edges 46 is transferred to the underlying conducting layer 42 by etching. An anisotropic plasma etching process using an etchant with an approximately 1:1 selectivity towards resist 40 and conducting layer 42 will replicate the slope in resist 40 to layer 42, as is known in the art. For example, photoresist and polysilicon can be etched with 1:1 selectivity by an $O_2$ and $CF_4$ reactive ion plasma. Outline 51 shows the original position of resist 40 prior to etching. After etching layer 42, a portion of substrate 44 is exposed.

The slope transferred to the underlying conducting layer 42 can be varied by changing the selectivity of the etching plasma used. If the plasma etches resist 40 faster than conducting layer 42, then the slope in edges 50 of conducting layer 42 will be shallower (exhibit a lesser angle from the horizontal) than the original slope in resist edges 46. On the other hand, if the plasma etches conducting layer 42 faster than resist 40, then the slope in edges 50 will be steeper (exhibit a greater angle from the horizontal) than the original slope in resist edges 46.

Figure 2D:
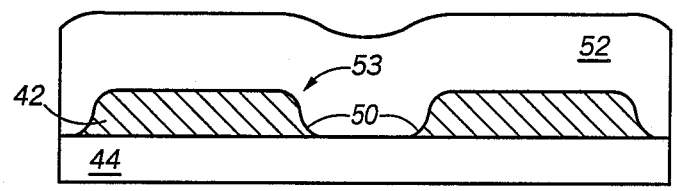

Finally, with reference to FIG. 2D, an oxide layer 52 is deposited overlying the patterned conducting layer 42 and the exposed portions of substrate 44. The sloped edges 50 enable better step coverge 53 at the corners of the openings in layer 42 than unsloped edges. This step coverage is important, for example, in the prevention of overlying passivation layer cracking. If the edges 50 were not sloped, the overlying layer 52 would have an inadequate thickness for step coverage 53.

It should be noted that the slope of resist edges 46 does not depend upon defocusing effects, but rather upon scattered radiation effects. This is known because the irradiation of the resist 40 is performed in the isofocal region whereby small deviations in lithography system focus alone will not substantially alter the slope of the resist edges 46 to be formed. The resist 40 used can be either a positive or negative resist, and one skilled in the art will recognize that the present invention can be used with either type of resist.

Other types of layers can be deposited instead of oxide layer 52 as needed for the formation of a variety of semiconductor devices in accordance with the present invention. In other embodiments of the invention, for example, a first polycrystalline silicon layer may be patterned with sloped edges to improve the step coverage of a second layer of polycrystalline silicon deposited subsequent to other intermediate layers which may be used in a particular semiconductor device. In another example, a collection of many intermediate layers may be etched simultaneously to formed sloped openings to improve the coverage of a subsequently deposited metal layer, say aluminum.

Also, other materials may be used for conducting layer 42. Layer 42 can be, for example, polycrystalline silicon or aluminum. Furthermore, the method of the invention works equally well for forming sloped openings 48 in insulating layers such as silicon oxide on a semiconductor device. The openings 48 can be intended for the formation of either apertures or interconnect in the layer 42 underlying the resist 40. It should be understood that the invention can be used to form either type of opening.

Figure 3:
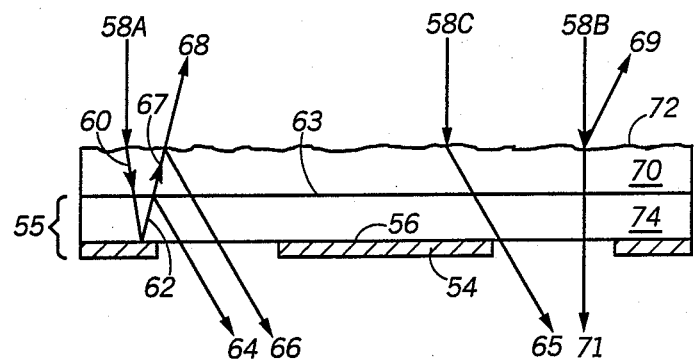
FIG. 3 illustrates, in cross-section, internal reflection of radiation within a lithography mask.

Promoting internal reflection of radiation within the lithographic mask and scattering element used for resist exposure significantly enhances the practice of the invention by improving the exposure efficiency. FIG. 3 illustrates the internal reflection of a radiation ray 58A, that originated at a radiation source in the lithography system, as it traverses through a scattering element 70 and a mask 55 consisting of transparent substrate 74 and opaque pattern 54. Scattering surface 72 can be, say, a randomly ground glass surface which will refract radiation ray 58A as it passes through surface 72 as new ray 60. The top surface 56 of opaque pattern 54 must be reflective for the promotion of substantial internal reflection. For example, the pattern 54 may be chrome which exhibits mirror-like surfaces reflecting almost all impinging radiation.

Ray 60 will be almost completely reflected by reflective surface 56 as ray 62 which travels to surface 63 and is there partially reflected as ray 64 and partially refracted as ray 67. Ray 64 passes through an opening in pattern 54, and ray 67 travels to surface 72 and is there partially reflected as ray 66 and partially refracted as ray 68. Ray 66 also passes through an opening in pattern 54 while ray 68 travels back towards the source of ray 58A.

Another radiation ray 58B passes through the scattering element 70 and substrate 74 as ray 71 which passes directly through an opening in pattern 54 with no internal reflection. Some of ray 58B is back-reflected at the surface 72 as ray 69. Still another ray 58C is refracted at scattering surface 72 as ray 65 which passes through an opening in pattern 54.

The portion of original radiation ray 58A or ray 58C which passes through an opening in opaque pattern 54 increases the efficiency of the lithographic system above that of a system having no internal reflection or no reflective surface 56. Without refraction at surface 72 or reflection at surface 56, rays 58A and 58C will be absorbed at surface 56 and will not contribute to the net radiation continuing past pattern 54 to irradiate a target resist layer.

Figure 4:
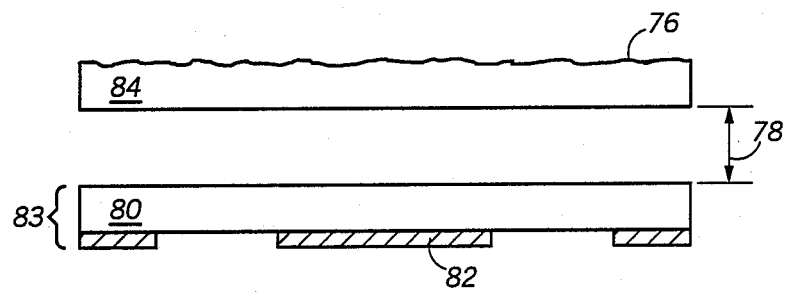
FIG. 4 illustrates, in cross-section, the use of a ground glass plate as a scattering element in accordance with one embodiment of the invention.

FIG. 4 illustrates a ground glass plate 84 and its relationship to a lithographic mask 83 in accordance with one embodiment of the invention. Ground glass plate 84 has a randomly ground surface 76 and acts as a scattering element removed a distance 78 from mask 83 having a quartz substrate 80 and a chrome pattern 82. It is not necessary, however, that plate 84 be separated from substrate 80. Plate 84 can also be placed directly on substrate 80. The degree of polishing of surface 76, as measured in grit size, can be varied to modify the slope formed in an opening in resist. As the coarseness of surface 76 increases, the scattering of the radiation passing through surface 76 increases, and the slope formed in a resist opening increases its inclination from the vertical.

FIG. 5 illustrates another embodiment of the invention in which a scattering ground surface 86 is provided directly on one face of a substrate 88 of a mask 89 having a pattern 90 on an opposite face.

The scattering element used in accordance with the invention is not limited to ground glass elements. Any surface provided on an element resulting in scattering of transmitted radiation is within the scope of the present invention. For example, spatial filters may be used as the scattering element. FIG. 6 illustrates a top-view of a portion of a spatial filter consisting of, for example, a uniform mesh 92. Mesh 92 is formed of many replications of a basic mesh pattern 94, for example a checkerboard pattern. Mesh pattern 94 is replicated in all directions 96 to form the full uniform mesh 92. Mesh pattern 94 could also be an arrangement of a plurality of fisheye lenses.

As a first specific, but non-limiting, example which further illustrates preferred embodiments of the invention, contact openings in a resist layer were sloped in accordance with the method disclosed above. A 700 nm layer of low temperature oxide was formed on a silicon wafer surface. A layer of resist having a thickness of 1800 nm was deposited overlying the low temperature oxide layer and then baked at about 100° C. A ground glass scattering element was prepared by grinding a piece of optical glass (having the dimensions of 1 mm thickness, 51 mm length, and 51 mm width) using 400 grit size wet/dry aluminum oxide paper. This ground glass scattering element was used during the baked resist exposure on a 5× Nikon wafer stepper with an exposure time of 600 ms. The exposed resist was then developed to form contact openings in the resist of about 1.5 micron size. These contact openings in the resist exhibited a slope of about 65 degrees from the horizontal. The oxide is etched through the openings in the resist using an $O_2$ and $CHF_3$ plasma to form contact openings in the oxide and to replicate the slope in the resist to the slope in the underlying oxide so that the contact openings in the oxide exhibit a slope of about 65 degrees from the horizontal.

As a second example, a 600 nm layer of field oxide was formed on a silicon wafer surface. A 1300 nm layer of resist was deposited overlying the field oxide layer and then baked at about 100° C. The ground glass scattering element from the first example was used during the exposure of the baked resist on a Perkin Elmer 1× projection aligner with an exposure energy of 240 mJ. The exposed resist was then developed to form contact openings in the resist of about 1.5 micron size. These contact openings in the resist exhibited a slope of about 60 degrees from the horizontal. The oxide is etched through the openings in the resist using an $O_2$ and $CHF_3$ plasma to form contact openings in the oxide and to replicate the slope in the resist to the slope in the underlying oxide so that the contact openings in the oxide exhibit a slope of about 60 degrees from the horizontal.

Although particular embodiments of the invention have been described in the foregoing description, it will be apparent to one skilled in the art that numerous modifications and variations can be made to the presented embodiments which still fall within the spirit and scope of the invention. Accordingly, it is intended that all such variations and modifications as fall within the scope of the appended claims be included within the invention.

We claim:

1. A method for irradiating a resist layer comprising the steps of:
   providing a resist layer overlying a semiconductor substrate, a patterned lithography mask, an optical scattering element, and a radiation source;
   positioning in optical alignment said mask above said resist layer, said radiation source above said mask, and said scattering element; and
   irradiating said resist layer with radiation from said radiation source.

2. The method of claim 1 wherein said step of providing a lithography mask comprises the steps of:
   providing a lithography mask comprising a transparent substrate having top and bottom faces, said bottom face supporting an opaque pattern having top and bottom sides, said top side being reflective and adjoining said bottom face; and
   positioning said mask with said substrate above said pattern.

3. The method of claim 1 wherein said step of providing a scattering element comprises providing a ground glass plate.

4. The method of claim 1 wherein said step of providing a scattering element comprises providing a ground surface on said mask.

5. The method of claim 1 wherein said step of providing a scattering element comprises providing a uniform mesh.

6. The method of claim 1 wherein said step of providing a uniform mesh comprises providing a checkerboard pattern.

7. The method of claim 1 wherein said step of providing a mask comprises providing a mask separable from said scattering element.

8. The method of claim 1 wherein said step of providing a scattering element comprises providing a diffuser.

9. A method for forming a sloped opening in a layer comprising the steps of:
   providing an etchable layer overlying a semiconductor substrate;
   providing a resist layer overlying said etchable layer;
   irradiating said resist layer with radiation passing through a patterned lithography mask and an optical scattering element;
   developing said resist layer to form an opening therethrough exposing a portion of said etchable layer;
   etching said etchable layer using said resist layer as an etching mask; and
   removing said resist layer.

10. The method of claim 9 wherein said step of providing an etchable layer comprises providing an oxide layer overlying a semiconductor substrate.

11. The method of claim 9 wherein said step of providing an etchable layer comprises providing a conducting layer overlaying a semiconductor substrate.

12. The method of claim 11 wherein said step of providing a conducting layer comprises providing a metal layer overlying a semiconductor substrate.

13. The method of claim 9 wherein said step of etching said etchable layer further comprises etching anisotropically.

14. The method of claim 9 wherein said step of etching said etchable layer using said resist layer as an etching mask further comprises etching said resist layer and said etchable layer with substantially equal selectivity.

* * * * *